United States Patent
Allen et al.

(10) Patent No.: US 7,102,359 B2
(45) Date of Patent: Sep. 5, 2006

(54) INTEGRATED FAULT DETECTOR CIRCUIT

(75) Inventors: Gordon H. Allen, Gilbert, AZ (US);
Peter J. Bills, Scottsdale, AZ (US);
Bryan Quinones, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/247,480

(22) Filed: Oct. 11, 2005

(65) Prior Publication Data

US 2006/0082376 A1 Apr. 20, 2006

Related U.S. Application Data

(60) Provisional application No. 60/619,155, filed on Oct. 15, 2004.

(51) Int. Cl.
*G01R 31/08* (2006.01)
*H03K 5/22* (2006.01)

(52) U.S. Cl. .................................. 324/522; 327/66
(58) Field of Classification Search ................ 324/522; 327/66
See application file for complete search history.

(56) References Cited

U.S. PATENT DOCUMENTS

| | | | |
|---|---|---|---|
| 5,886,543 A * | 3/1999 | Moody ......................... | 327/77 |
| 6,348,820 B1 | 2/2002 | Bennett et al. | |
| 2005/0083086 A1* | 4/2005 | Horn ........................... | 327/108 |
| 2006/0034030 A1* | 2/2006 | Andersen et al. ........... | 361/118 |

* cited by examiner

*Primary Examiner*—Anjan Deb
*Assistant Examiner*—Amy He
(74) *Attorney, Agent, or Firm*—Michael J. Balconi-Lamica

(57) ABSTRACT

According to one embodiment, an integrated fault detector circuit is used to detect one or more of the open circuit and short circuit of a load connected to an integrated circuit power MOSFET driver by directly detecting the level of current flowing in a floating current source.

20 Claims, 4 Drawing Sheets

INTEGRATED FAULT DETECTOR CIRCUIT

REFERENCE TO PRIOR APPLICATION

This application claims priority to Provisional Patent Application, Ser. No. 60/619,155, entitled "Integrated Configurable Fault Detector Circuit", Allen et al., filed Oct. 15, 2004.

BACKGROUND

The present disclosures generally relate to integrated circuits, and more particularly, to an integrated fault detector circuit and method for detecting a fault.

Existing fault detector circuits utilize voltage monitoring as the principal method of detecting open load conditions. Such circuits utilize a voltage comparator and a floating current source, each connected across the drain and source of a high-current switch transistor. When the high-current switch transistor is in the OFF state and the load is connected properly, the voltage across the high-current switch transistor will be equal to the supply voltage. However, if the load becomes disconnected, the small amount of current flowing in the floating current source will cause the differential voltage of the high-current switch transistor to collapse. Such a collapse of the differential voltage is detected by the voltage comparator and reported as an open-load fault.

In a known fault detection circuit 10, such as shown in FIG. 1, a high current switch 12 is connected in a low-side configuration. High current switch transistor 12 can comprise, for example, an n-channel MOSFET and includes source 14, drain 16 and gate 18 terminals. The fault detector circuit 10 of FIG. 1 uses floating current source transistors M3 and M9, indicated by reference numerals 20 and 22, respectively. The floating current source provides a controlled current from the drain to source of the MOSFET device. As noted above, if the load becomes disconnected, the small amount of current flowing in the floating current source will cause the voltage from drain to source of the high-current switch transistor 12 to collapse. In addition, the fault detector circuit 10 uses voltage divider resistors R1 and R2, generally indicated by reference numeral 24, to attenuate the drain voltage (sns_DRAIN) of high current switch transistor 12 to the positive input 26 of the comparator (COMP1), indicated by reference numeral 28. The fault detector circuit 10 further includes voltage divider resistors R3 and R4, generally indicated by reference numeral 30, to attenuate the source voltage (sns_SOURCE) of high current switch transistor 12 to the negative input 32 of the comparator 28. Comparator 28 determines when the voltage between the drain 16 and the source 14 is (i) greater than or (ii) less than a predetermined threshold voltage, for example, Vds>3V. When the high current switch 12 is OFF and the combined small current flowing in floating current source transistor (M9) 22 plus the small current flowing in R1 and R2 is sufficient to pull the drain voltage below its predetermined threshold voltage, the comparator output (OUTPUT) 34 is driven low. The circuit 10 of FIG. 1 is configured for a low-side drive application, wherein the load (RLOAD) 60 is connected between a battery (VBATT) 62 and the drain terminal 16 of the high current switch transistor 12. To complete the circuit, the source 14 of the high current switch transistor 12 is connected to VSS. A low voltage on the comparator output 34 indicates that the load (RLOAD) 60, which should be connected to the high current switch transistor 12, is absent.

Circuit 10 still further comprises transistors (M4,M6) 40 and 42, current source (I1) 44, and transistors (M7,M8) 46 and 48. Voltage VCP is indicated by reference numeral 50, voltage V5 is indicated by reference numeral 52, and voltage VSS is indicated by reference numeral 54.

Further with respect to FIG. 1, VCP is a power supply voltage, indicated by reference numeral 50, which must exceed the maximum required voltage at the source of the high current switch transistor (when the transistor is utilized in a high side drive configuration). In the high side drive configuration, the load resistor is connected between the source terminal of the high current switch transistor and VSS and the drain of the high current switch transistor is connected to VBATT. The reason that VCP must be greater than the source voltage is to provide the required operating voltage for transistors M3, M9, M4 and M6, as indicated by reference numerals 20, 22, 40 and 42, respectively.

V5 is a power supply voltage required to power current source I1 and mirror transistors M7 and M8, as indicated by reference numerals 44, 46 and 48, respectively. In addition, VSS is another power supply voltage, indicated by reference numeral 54, such as a negative supply voltage required to power current source I1 and mirror transistors M7 and M8. VSS also provides a reference potential for resistors R1, R2, R3 and R4, as indicated collectively by reference numerals 24 and 30. VSS can comprise a negative power supply voltage, zero volts, or a suitable voltage other than zero volts, as may be required for a given circuit implementation. In the low side drive configuration pictured in FIG. 1, VSS also powers transistors M3, M9 and the high current switch transistor, indicated by reference numerals 20, 22 and 12, respectively.

Current source I1, indicated by reference numeral 44, comprises a current source which those skilled in the art of circuit design recognize may be realized in many different ways such as a single resistor or combinations of transistors and resistors. Transistors M4 and M6, indicated by reference numerals 40 and 42, respectively, comprise p-channel MOSFET transistors connected as a current mirror. The current mirror may also be realized in many different ways, for example, with use of pnp transistors.

Transistors M7 and M8, indicated by reference numerals 46 and 48, respectively, comprise n-channel MOSFET transistors connected as a current mirror. The current mirror may also be realized in many different ways, for example, with use of npn transistors.

In known fault detector circuits, when the maximum voltage which may appear at the drain and source of the high current output switch transistor is relatively high, resistance voltage dividers must be used to attenuate these voltages to levels which can be accommodated by low cost, low complexity voltage comparators.

In addition, some fault detection applications may require that very low values of current be used to detect open load faults. However, the current drawn by the voltage divider resistors in existing fault detectors undesirably increases the level of such a detect current.

Accordingly, there is a need for an improved fault detector circuit and method for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

According to one embodiment of the present disclosure, the integrated fault detector circuit eliminates a voltage comparator along with voltage divider resistors, while improving performance and retaining the required fault detection functionality.

The method for detecting a fault, according to the embodiments of the present disclosure, simplifies and shrinks the silicon area required to perform the fault the level of current flowing in the floating current source, as described herein. When a load that should normally be attached to the high current switch transistor is absent (that is, an open load), the current that flows in the floating current source is zero. Such a zero current in the floating current source is directly detected and reported as an open load condition. The embodiments of the fault detector circuit implementation of the present disclosure also detect shorted loads.

Figure 2:
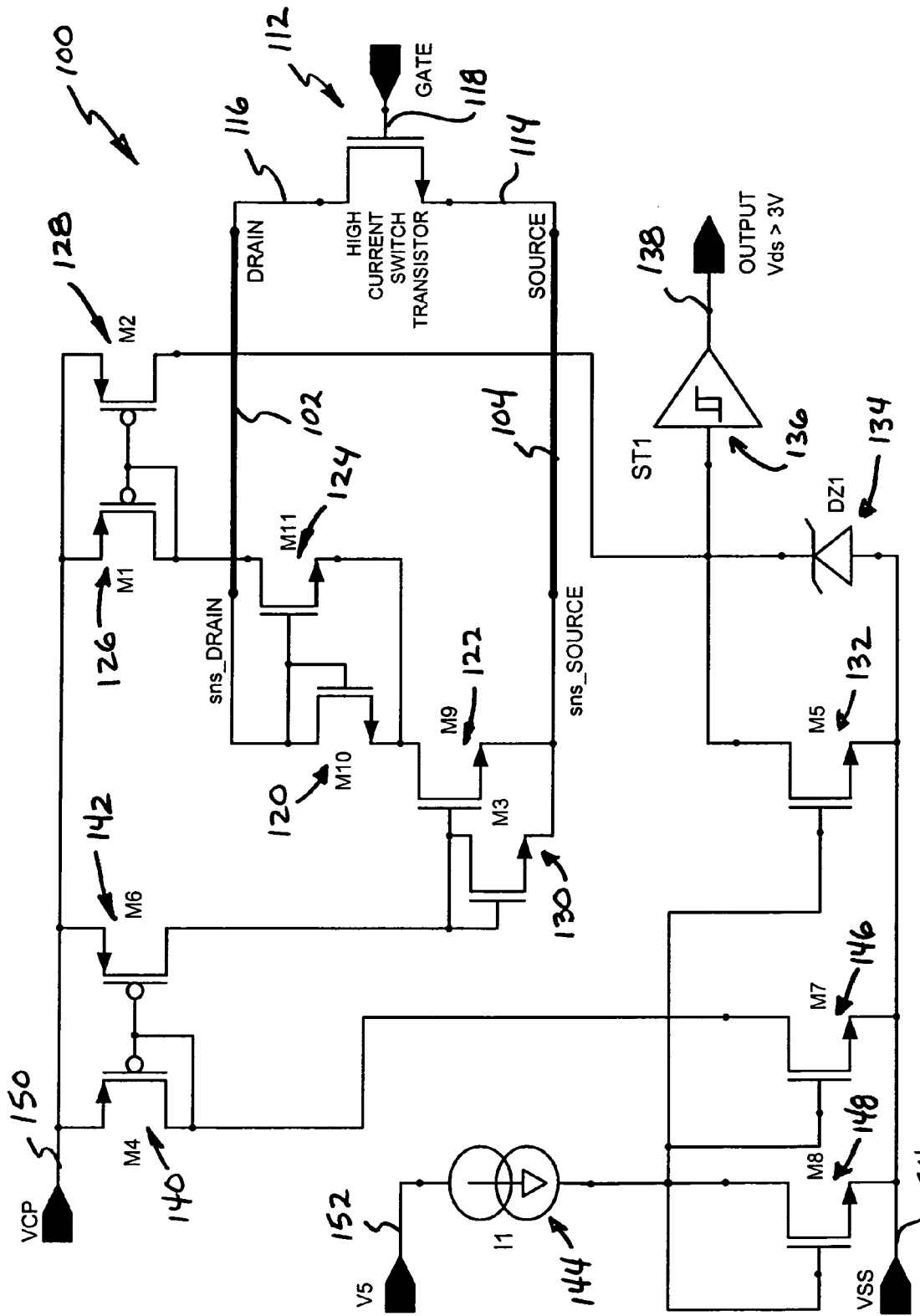
FIG. 2 is a schematic circuit diagram view of an integrated fault detector circuit for a configurable driver according to one embodiment of the present disclosure.

FIG. 2 illustrates the structure of the integrated fault detector circuit 100 according to one embodiment of the present disclosure. High current n-channel output switch transistor 112 includes source 114, drain 116 and gate 118 terminals. The sns_DRAIN and sns_SOURCE pins, 102 and 104, respectively, of the fault detector circuit are connected to the drain and source electrodes 116 and 114, respectively, of the high current switch transistor 112. Circuit 100 also includes a fault detection n-channel transistor device (M10) 120 and a floating current source n-channel transistor (M9) 122 disposed between the sns_DRAIN and sns_SOURCE pins, 102 and 104, respectively. Fault detection transistor device (M10) 120 is coupled in a mirrored configuration with n-channel transistor device (M11) 124. A drain terminal of transistor device (M11) 124 is coupled to a mirror transistor configuration of p-channel transistor devices (M1) and (M2). Furthermore, transistor (M9) 122 is coupled in a floating current source configuration with n-channel transistor device (M3) 130. Circuit 100 further comprises transistor (M5) 132, zener diode device (DZ1) 134, and Schmitt Trigger device (ST1) 136.

Circuit 100 still further comprises transistors (M4 and M6) 140 and 142, current source (I1) 144, and transistors (M7 and M8) 146 and 148, similarly, as discussed herein above with respect to the circuit 10 in FIG. 1. Furthermore, a positive supply voltage VCP 150, voltage V5 152, and negative supply voltage VSS 154 are similar, as discussed herein above with respect to the similar elements of FIG. 1.

Transistor M5, indicated by reference numeral 132, is connected as a constant current source transistor. Transistor 132 provides a load current for mirror transistor M2, indicated by reference numeral 128. When the current flowing in transistor 132 is larger than the current flowing in transistor 128, then the voltage at the drain of transistor 132 is near its source voltage. If the source voltage of transistor 132 is ground potential, then the drain voltage of transistor 132 is near ground potential. In addition, zener diode DZ1, indicated by reference numeral 134, limits a maximum voltage that can occur at the drain of transistor 132. Furthermore, in one embodiment, Schmitt Trigger device 136 comprises a non-inverting Schmitt Trigger device, as indicated by the label located within the ST1 symbol that indicates non-inverting operation.

In the embodiment of the fault detector circuit of FIG. 2, the minimum voltage difference between sns_DRAIN 102 and sns_SOURCE 104 at which current will flow in transistor device (M10) 120 to perform the fault detect function is the turn-on threshold voltage of transistor M10. However, some applications may require a larger voltage difference than the turn-on threshold voltage of transistor M10 for reliable operation. For these applications, a suitable diode and/or other suitable offset-voltage-producing-circuitry may be placed between the drain of current sense transistor M9 and the point which joins the source of transistor device M10 and the source of transistor device M11, and which provides a combined turn-on threshold voltage of sufficient magnitude to satisfy the requirements of the particular fault detection application. It would be equally effective to add a suitable diode and/or other offset-voltage-producing-circuitry which has a combined turn-on threshold voltage of sufficient magnitude between the point in the circuit where the drain and gate of transistor device M10 connect and the drain of the high current switch transistor 112. Furthermore, for such applications, the need for a larger voltage difference between sns_DRAIN and sns_SOURCE could be accomplished by adding a suitable diode and/or other suitable offset-voltage-producing-circuitry in both locations as described above.

In another embodiment, while it is noted that the circuitry shown in FIG. 2 is based upon the use of MOS transistors, the same functionality may be realized using bipolar transistors. In yet another embodiment, while the circuitry illustrated in FIG. 2 includes the use of mostly n-channel transistors, the functionality may be realized using p-channel transistors in place of n-channel transistors. In addition, high current switch transistor 112 could also include a p-channel MOSFET, an NPN device, a PNP device, a Thyristor, a mechanical relay, or other suitable high current switch device.

In another embodiment, while it is noted that if the circuitry of FIG. 2 is realized using npn transistors and pnp transistors, the resulting functionality may also be realized using npn transistors in place of pnp transistors and pnp transistors in place of npn transistors.

In general, the functionality shown in FIG. 2 may be realized using one or more of a variety of n-channel MOS transistors and diodes, p-channel MOS transistors and diodes, npn bipolar transistors and diodes, pnp bipolar transistors and diodes, n-channel JFET transistors and diodes, p-channel JFET transistors and diodes, MESFET transistors, Schottky diodes, four layer diodes, etc.

Still further, the applications of the circuit shown in FIG. 2 along with the variations of the circuit of FIG. 2 are not limited to the use of an n-channel MOS output transistor, such as high current switch transistor 112. The circuit shown in FIG. 2 may be applied to a wide variety of switches in place of a high current switch transistor 112. For example, the wide variety of switches can include, but not limited to, one or more of p-channel MOS transistors, npn transistors, pnp transistors, and mechanical relay switches.

Figure 3:
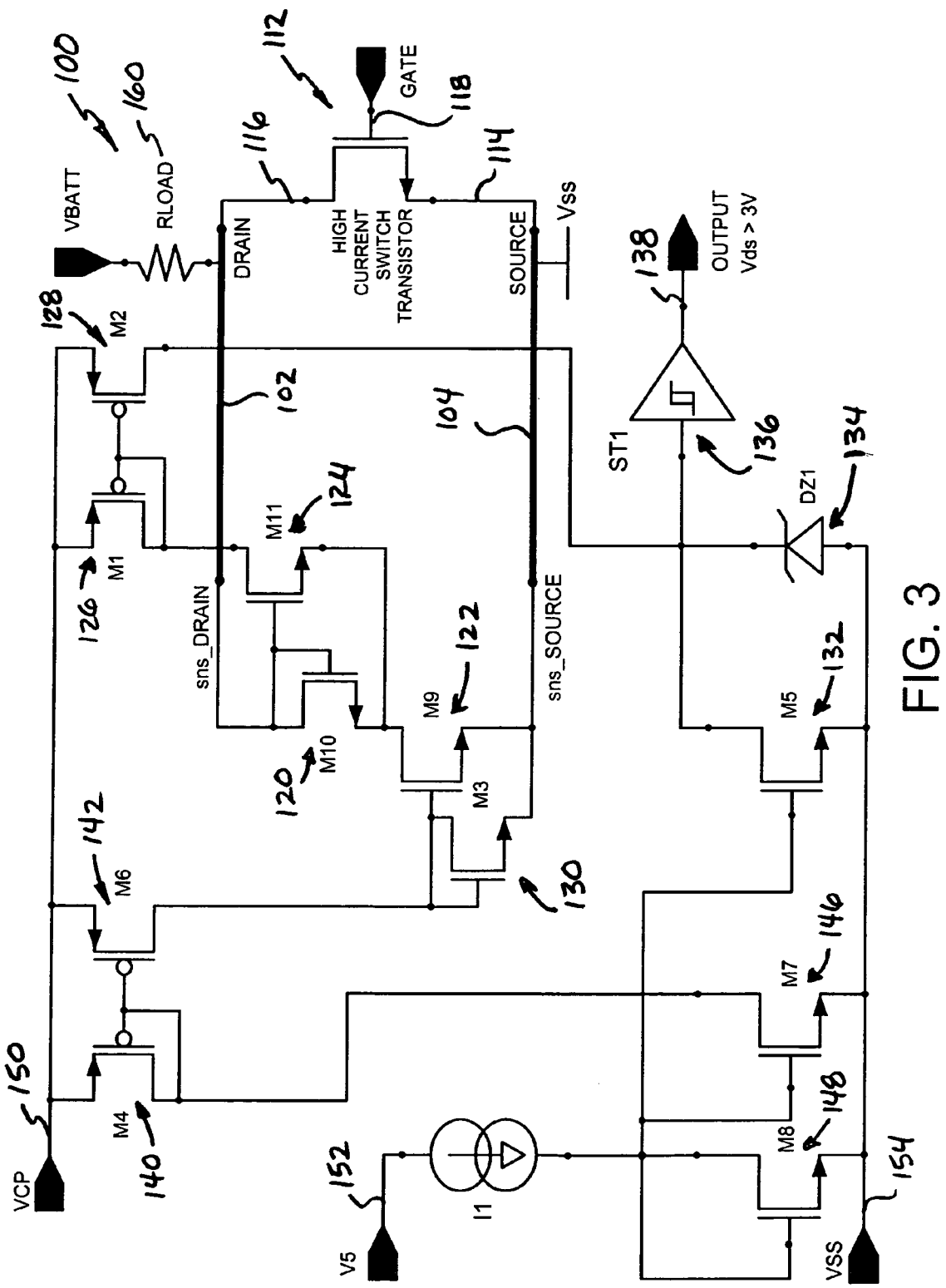
FIG. 3 is a schematic circuit diagram view of an integrated fault detector circuit in a low-side drive application according to one embodiment of the present disclosure.
Figure 4:
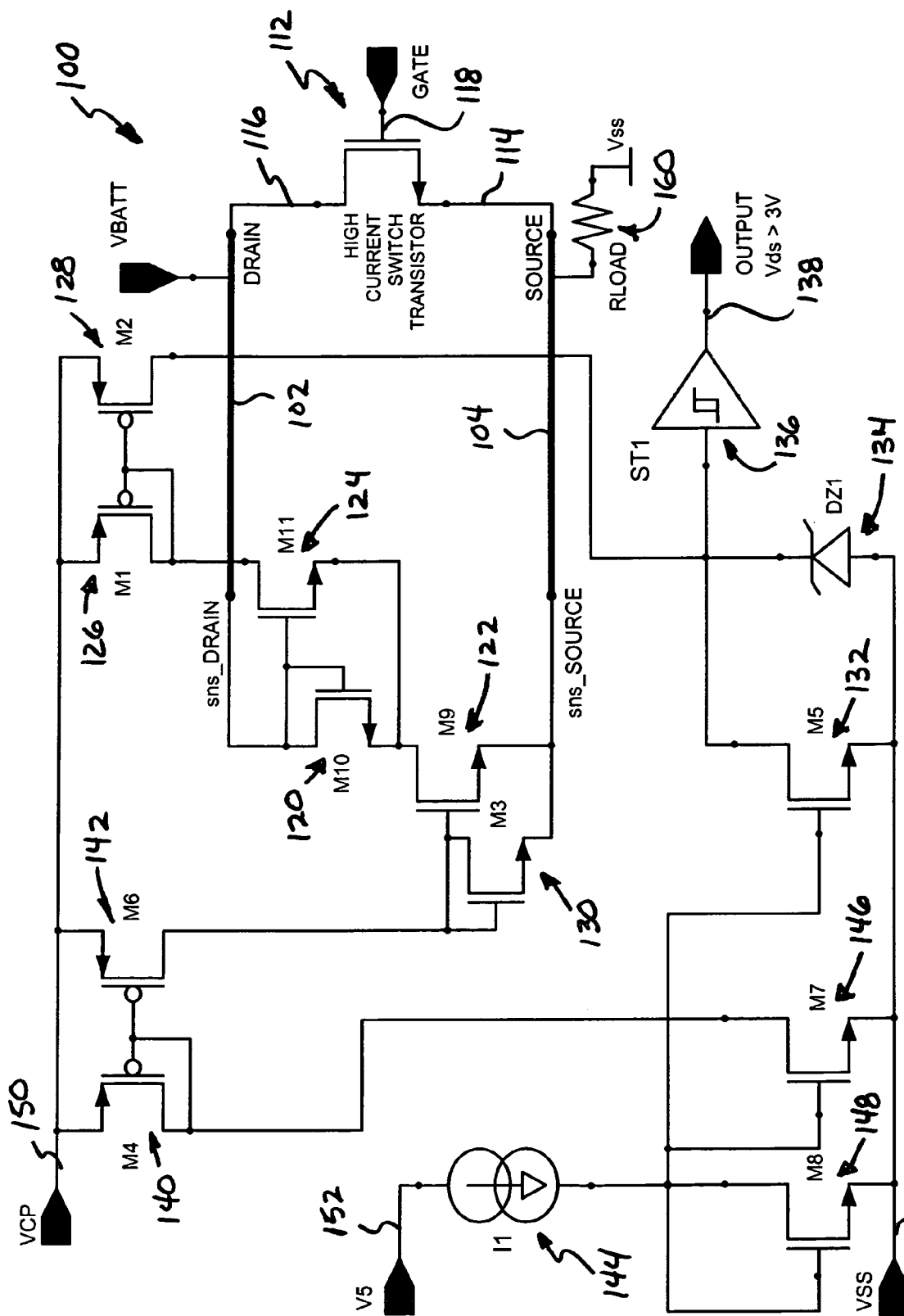
FIG. 4 is a schematic circuit diagram view of an integrated fault detector circuit in a high-side drive application according to one embodiment of the present disclosure.

In operation, the fault detector circuit performs an open/short detect function regardless of the high side/low side configuration of transistor 112. For low-side drive applications (FIG. 3), the load 160 is connected between a battery and the drain terminal of the high current switch transistor 112. To complete the circuit, the source of the high current switch transistor 112 is tied to VSS. For high-side drive applications (FIG. 4), the load 160 is connected between the high current switch transistor 112 source terminal and VSS. To complete the circuit the drain terminal of the transistor 112 is connected to the battery (VBATT). While the fault detector circuits of FIGS. 3 and 4 use floating current source transistors M3 and M9 and mirror transistors M10, M11, M1 and M2, it is noted however that the prior known fault detector circuit of FIG. 1 does not use any transistors similar in function to mirror transistors M10, M11, M1 and M2.

With respect to the embodiments of the present disclosure, circuit operation is substantially identical for low side and high side drive applications. A small magnitude of constant current from transistor M6 is mirrored through floating current source transistor M3 and forms a constant current source from sns_DRAIN to sns_SOURCE through floating current source transistor M9. The total current through transistor M9 is equal to the combined current from transistor devices M10 and M11. With sufficient sns_DRAIN to sns_SOURCE voltage, the current through transistor device M10 is mirrored to transistor device M11. Current through transistor device M11 is then mirrored using transistors M1 to M2. With the high current switch transistor OFF and the sns_DRAIN and sns_SOURCE voltages pulled to their respective supplies (VBATT and VSS), the circuit will acknowledge that the load is intact by placing a logic high on output 138.

With the load open, the voltage difference between sns_DRAIN and sns_SOURCE collapses due to current flowing in current source transistors M3 and M9, indicated by reference numerals 130 and 122, respectively. With insufficient voltage between sns_DRAIN and sns_SOURCE, 102 and 104, respectively, the current through transistor 120 approaches 0.0 µA. Because the current through transistor device 120 is mirrored to transistor device 128, the transistor device 128 current also approaches 0.0 µA. With 0.0 µA of current out of transistor device 128, the voltage at the input of Schmitt trigger 136 will decrease to zero (0) volts and the output 138 is driven low. Such a logic low state on output 138 indicates that the load is open. The circuit operation for short detection is substantially identical to open load detection. Both monitor schemes use the sns_DRAIN to sns_SOURCE voltage to detect the occurrence of a fault.

During on-state shorts, the sns_DRAIN to sns_SOURCE voltage will increase sufficiently to cause current to flow through transistor device 120. Such a current is mirrored through the circuit, causing a logic high state on output 138. The following truth table (TABLE 1) indicates and illustrates faulted and un-faulted states. In TABLE 1, switch state indicates whether the high current switch transistor 112 is either OFF or ON. Fault output refers to the logic level of the fault detector circuit Schmitt trigger output.

TABLE 1

| Switch State | Load Normal | Load Open | Load Short | Fault Output | Comment |
| --- | --- | --- | --- | --- | --- |
| OFF | X | | | High | |
| OFF | | X | | Low | |
| OFF | | | X | High | No short detect in OFF state |
| ON | X | | | Low | |
| ON | | X | | Low | No open detect in ON state |
| ON | | | X | High | |

In connection with the operation of the fault sense circuitry, according to one embodiment of the present disclosure, the fault detector circuit uses a floating current source. The current flowing through mirror transistor M3 is provided from VCP. Transistor M3 is mirror coupled to transistor M9. This configuration forces a scaled amount of current to flow through transistor M9. Current flowing through M9 is monitored by transistor M10 and delivered to the sns_SOURCE pin reference numeral 104. The current flowing into the drain terminal of M10 is provided from the sns_DRAIN pin reference numeral 102. Transistor M10 is mirror coupled to transistor M11. This configuration forces a scaled amount of current to flow through transistor M11. Drain current through M11 is effectively mirrored through transistors M1 and M2. The current flowing through M2 provides a control signal to Schmitt Trigger ST1. When the current flowing through transistor M2 is greater than current in transistor M5, the input to the Schmitt Trigger ST1 is forced high.

Figure 1:
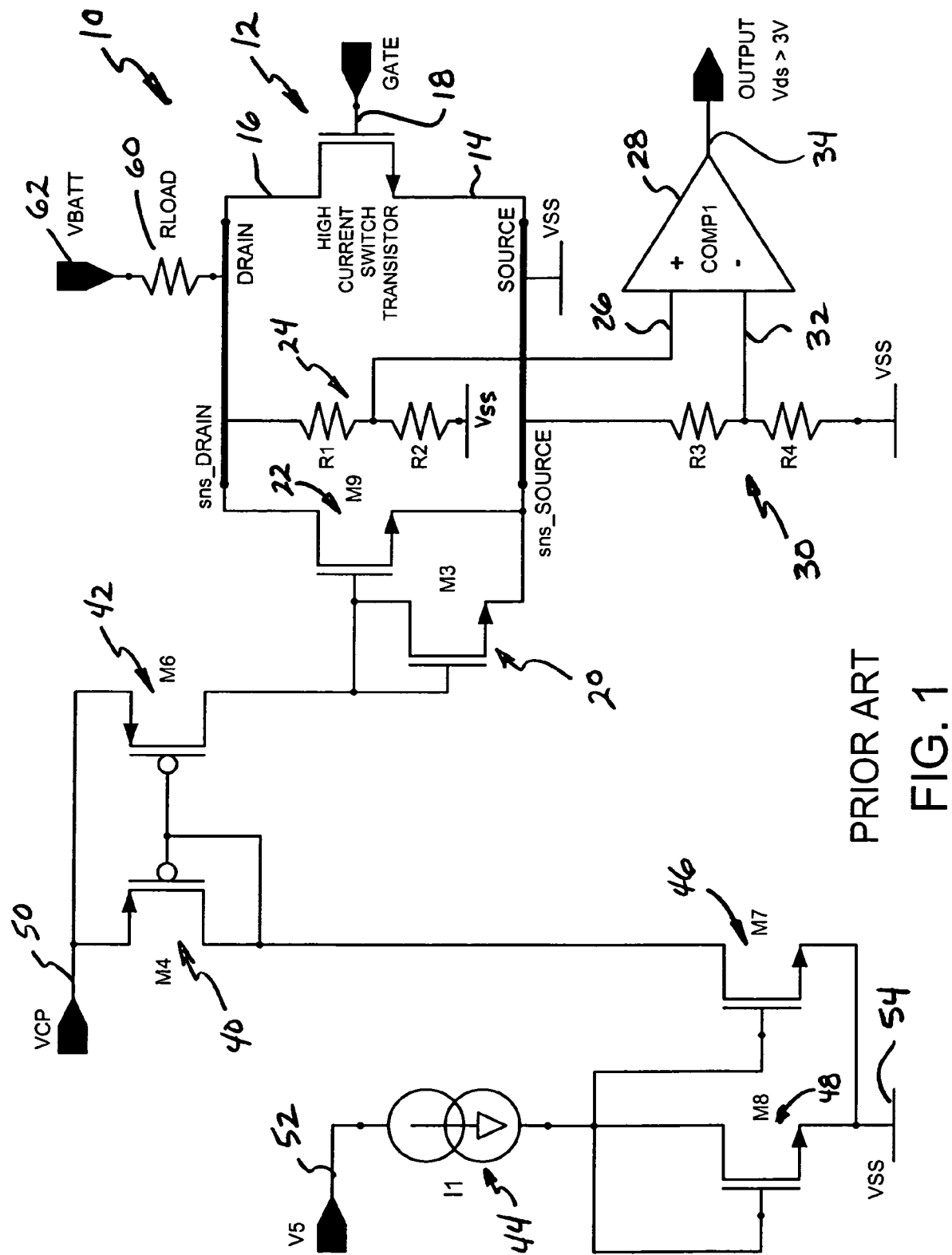
FIG. 1 is a schematic circuit diagram view of a known fault detector circuit.

The embodiments of the present disclosure provide one or more improvements over the prior known circuit as shown in FIG. 1. The improvements include, but are not limited to, the following:

1. Reduction in silicon area. The elimination of voltage divider resistors and a high quality voltage comparator from the fault detector circuit simplifies its design and shrinks its layout. Products typically have multiple identical driver outputs. Reducing the size of the fault detector for each driver significantly reduces die area and increases the profitability of the corresponding integrated circuit product.

2. Removal of the voltage divider resistors also increases the practical operating voltage range of the fault detect circuit. For example, the prior art circuit requires 900 µA for full operation from 5.5V to 24.5V. In contrast, the practical operating voltage range of the improved fault detector circuit according to the embodiments of the present disclosure is not limited by the current consumption of the resistor voltage divider. As a result, an increased operating voltage range of the fault detector circuit is possible.

According to one embodiment, a fault detector circuit comprises: a high current switch having a first and second terminals; a floating current source; a first current mirror configuration, the first current mirror configuration and the floating current source being coupled in series between the first and second terminals of the high current switch; a second current mirror configuration coupled to the first current mirror configuration, wherein a current flowing through the floating current source is mirrored by the first current mirror configuration to the second current mirror configuration, further wherein the current contains information concerning one of a normal load, an open load, or a shorted load condition on the high current switch; and a Schmitt trigger having an input and an output, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

In other embodiments, the high current switch can comprise a high current switch transistor, wherein the first terminal corresponds to a drain terminal and the second terminal corresponds to a source terminal. In addition, the high current switch transistor can comprise a high current MOSFET transistor. Furthermore, the first mirror configuration can be of a first polarity, and the second mirror configuration can be of a second polarity, the second polarity being opposite to the first polarity. The Schmitt trigger can be configured for non-inverting operation.

The fault detector circuit can further comprise a constant current source transistor coupled to an input of the Schmitt trigger. Furthermore, a drain of the constant current source transistor is coupled to the input of the Schmitt trigger. The fault detector circuit can still further comprise a zener diode coupled to an input of the Schmitt trigger, wherein the zener diode limits a maximum voltage at the drain of the constant current source transistor.

In another embodiment, the fault detector circuit further comprises a load, wherein the load is coupled to the circuit in one of (i) a low-side drive configuration or (ii) a high-side drive configuration. For the low-side drive configuration, the load is coupled between the first terminal of the high current switch and a first voltage and wherein the second terminal of the high current switch is coupled to a second voltage. For the high-side drive configuration, the load is coupled between the second terminal of the high current switch and a second voltage, wherein the first terminal of the high current switch is coupled to the first voltage. Furthermore, the first voltage can be greater than the second voltage.

In yet a further embodiment, a fault detector circuit comprises: a high current switch transistor having a first and second terminals, wherein the first terminal corresponds to a drain terminal and the second terminal corresponds to a source terminal; a floating current source; a first current mirror configuration, the first current mirror configuration and the floating current source being coupled in series between the first and second terminals of the high current switch; a second current mirror configuration coupled to the first current mirror configuration, wherein the first mirror configuration is of a first polarity, and wherein the second mirror configuration is of a second polarity, the second polarity being opposite to the first polarity, and further wherein a current flowing through the floating current source is mirrored by the first current mirror configuration to the second current mirror configuration, the current containing information concerning one of a normal load, an open load, or a shorted load condition on the high current switch; and a Schmitt trigger having an input and an output, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

According to another embodiment, a fault detection method comprises: providing a high current switch having a first and second terminals; coupling a floating current source and a first current mirror configuration in series between the first and second terminals of the high current switch; coupling a second current mirror configuration to the first current mirror configuration, wherein a current flowing through the floating current source is mirrored by the first current mirror configuration to the second current mirror configuration, further wherein the current contains information concerning one of a normal load, an open load, or a shorted load condition on the high current switch; and coupling a Schmitt trigger to the second current mirror configuration, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the present embodiments can apply to automotive current drivers having either a low-side drive configuration or a high-side drive configuration.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A fault detector circuit comprising:
a high current switch having a first and second terminals;
a floating current source;
a first current mirror configuration, the first current mirror configuration and the floating current source being coupled in series between the first and second terminals of the high current switch;
a second current mirror configuration coupled to the first current mirror configuration, wherein a current flowing through the floating current source is mirrored by the first current mirror configuration to the second current mirror configuration, further wherein the current contains information concerning one of a normal load, an open load, or a shorted load condition on the high current switch; and
a Schmitt trigger having an input and an output, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

2. The circuit of claim 1, wherein the high current switch comprises a high current switch transistor.

3. The circuit of claim 2, wherein the first terminal corresponds to a drain terminal and the second terminal corresponds to a source terminal.

4. The circuit of claim 2, further wherein the high current switch transistor comprises a high current MOSFET transistor.

5. The circuit of claim 1, wherein the first mirror configuration is of a first polarity, and wherein the second mirror configuration is of a second polarity, the second polarity being opposite to the first polarity.

6. The circuit of claim 1, wherein the Schmitt trigger is configured for non-inverting operation.

7. The circuit of claim 1, further comprising a constant current source transistor coupled to an input of the Schmitt trigger.

8. The circuit of claim 7, further wherein a drain of the constant current source transistor is coupled to the input of the Schmitt trigger, said circuit further comprising:
   a zener diode coupled to an input of the Schmitt trigger, wherein the zener diode limits a maximum voltage at the drain of the constant current source transistor.

9. The circuit of claim 1, further comprising a load, wherein the load is coupled to the circuit in one of (i) a low-side drive configuration or (ii) a high-side drive configuration.

10. The circuit of claim 9, wherein for the low-side drive configuration, the load is coupled between the first terminal of the high current switch and a first voltage and wherein the second terminal of the high current switch is coupled to a second voltage.

11. The circuit of claim 10, wherein the first voltage is greater than the second voltage.

12. The circuit of claim 9, wherein for the high-side drive configuration, the load is coupled between the second terminal of the high current switch and a second voltage, wherein the first terminal of the high current switch is coupled to the first voltage.

13. The circuit of claim 12, wherein the first voltage is greater than the second voltage.

14. A fault detector circuit comprising:
   a high current switch transistor having a first and second terminals, wherein the first terminal corresponds to a drain terminal and the second terminal corresponds to a source terminal;
   a floating current source;
   a first current mirror configuration, the first current mirror configuration and the floating current source being coupled in series between the first and second terminals of the high current switch;
   a second current mirror configuration coupled to the first current mirror configuration, wherein the first mirror configuration is of a first polarity, and wherein the second mirror configuration is of a second polarity, the second polarity being opposite to the first polarity, and further wherein a current flowing through the floating current source is mirrored by the first current mirror configuration to the second current mirror configuration, the current containing information concerning one of a normal load, an open load, or a shorted load condition on the high current switch; and
   a Schmitt trigger having an input and an output, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

15. The circuit of claim 14, further comprising a load, wherein the load is coupled to the circuit in one of (i) a low-side drive configuration or (ii) a high-side drive configuration.

16. The circuit of claim 15, wherein for the low-side drive configuration, the load is coupled between the first terminal of the high current switch and a first voltage and wherein the second terminal of the high current switch is coupled to a second voltage, and further wherein for the high-side drive configuration, the load is coupled between the second terminal of the high current switch and a second voltage, wherein the first terminal of the high current switch is coupled to the first voltage.

17. The circuit of claim 16, still further wherein the first voltage is greater than the second voltage.

18. A fault detection method comprising:
   providing a high current switch having a first and second terminals;
   coupling a floating current source and a a first current mirror configuration in series between the first and second terminals of the high current switch;
   coupling a second current mirror configuration to the first current mirror configuration, wherein a current flowing through the floating current source is mirrored by the first current mirror configuration to the second current mirror configuration, further wherein the current contains information concerning one of a normal load, an open load, or a shorted load condition on the high current switch; and
   coupling a Schmitt trigger to the second current mirror configuration, wherein the second current mirror configuration is coupled to the input of the Schmitt trigger and wherein the Schmitt trigger output is representative of one of a faulted state or an un-faulted state, as a function of one of the normal load condition, the open load condition, or the shorted load condition on the high current switch.

19. The method of claim 18, further comprising:
   coupling a load to the high current switch in one of (i) a low-side drive configuration or (ii) a high-side drive configuration.

20. The method of claim 19, wherein for the low-side drive configuration, the load is coupled between the first terminal of the high current switch and a first voltage and wherein the second terminal of the high current switch is coupled to a second voltage, and further wherein for the high-side drive configuration, the load is coupled between the second terminal of the high current switch and a second voltage, wherein the first terminal of the high current switch is coupled to the first voltage, still further wherein the first voltage is greater than the second voltage.

* * * * *